(12) United States Patent
Hung et al.

(10) Patent No.: US 8,976,600 B2
(45) Date of Patent: Mar. 10, 2015

(54) WORD LINE DRIVER CIRCUIT FOR SELECTING AND DESELECTING WORD LINES

(71) Applicant: Macronix International Co., Ltd., Hsinchu (TW)

(72) Inventors: Chun-Hsiung Hung, Hsinchu (TW); Ti Wen Chen, Tainan (TW); Shuo-Nan Hung, Jhubei (TW); Shih-Lin Huang, Magong (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/046,428

(22) Filed: Oct. 4, 2013

(65) Prior Publication Data

US 2014/0254284 A1    Sep. 11, 2014

Related U.S. Application Data

(60) Provisional application No. 61/775,723, filed on Mar. 11, 2013.

(51) Int. Cl.
*G11C 16/06* (2006.01)
*G11C 16/16* (2006.01)

(52) U.S. Cl.
CPC .................................... *G11C 16/16* (2013.01)
USPC .................. 365/185.23; 365/185.29; 365/203

(58) Field of Classification Search
CPC ........ G11C 16/10; G11C 16/08; G11C 16/16; G11C 16/344; G11C 16/30; G11C 11/5635
USPC ............. 365/195.23, 185.29, 185.18, 185.17, 365/185.25, 185.2
See application file for complete search history.

(56) References Cited

U.S. PATENT DOCUMENTS 5,801,991 A    9/1998    Keeney et al.
6,906,940 B1    6/2005    Lue
(Continued)

OTHER PUBLICATIONS

Johnson M. et al., "512-Mb PROM With a Three-Dimensional Array of Diode/Antifuse Memory Cells," IEEE Journ. Solid-State Circuits 83(11), Nov. 2003, pp. 1920-1928.

(Continued)

*Primary Examiner* — David Lam
(74) *Attorney, Agent, or Firm* — Kenta Suzue; Haynes Beffel & Wolfeld LLP

(57) ABSTRACT

A memory circuit includes word lines coupled to a memory array, including a first set of one or more word lines deselected in an erase operation, and a second set of one or more word lines selected in the erase operation. Control circuitry couples the first set of one or more word lines deselected in the erase operation to a reference voltage, responsive to receiving an erase command for the erase operation. Some examples further include a first transistor that switchably couples a word line to a global word line, and a second transistor that switchably couples the word line to a ground voltage. The control circuitry is coupled to the first transistor and the second transistor, wherein the control circuitry has a plurality of modes including at least an erase operation. In a first mode, the first transistor couples the word line to the global word line, and the second transistor decouples the word line from the ground voltage. In a second mode, the first transistor decouples the word line from the global word line, and the second transistor couples the word line to the ground voltage.

20 Claims, 15 Drawing Sheets

(56) References Cited

U.S. PATENT DOCUMENTS

| | | |
|---|---|---|
| 7,227,783 B2 | 6/2007 | Li |
| 7,315,474 B2 | 1/2008 | Lue |
| 7,433,235 B2 | 10/2008 | Chae et al. |
| 7,453,729 B2 | 11/2008 | Lee |
| 8,289,775 B2 * | 10/2012 | Lee et al. ............... 365/185.18 |
| 8,503,213 B2 | 8/2013 | Chen et al. |
| 8,743,624 B2 * | 6/2014 | Lutze et al. ............ 365/185.29 |
| 8,760,928 B2 | 6/2014 | Chen et al. |
| 2010/0270593 A1 | 10/2010 | Lung et al. |
| 2011/0116309 A1 | 5/2011 | Lung |
| 2011/0235398 A1 | 9/2011 | Hosono |
| 2011/0235408 A1 | 9/2011 | Minemura et al. |
| 2011/0305088 A1 | 12/2011 | Huang et al. |
| 2012/0007167 A1 | 1/2012 | Hung et al. |
| 2012/0182802 A1 | 7/2012 | Hung et al. |
| 2013/0088920 A1 | 4/2013 | Huang et al. |
| 2014/0198576 A1 | 7/2014 | Hung et al. |

OTHER PUBLICATIONS

Jung S-M et al., "Three Dimensionally Stacked NAND Flash Memory Technology Using Stacking Single Crystal Si Layers on ILD and TANOS Structure for Beyond 30 nnm Node," IEEE Int'l Electron Devices Meeting, Dec. 2006, 4pp.

Lai E-K et al., "A Multi-Layer Stackable Thin-Film Transistor (TFT) NAND-Type Flash Memory," IEEE Int'l Electron Devices Meeting, Dec. 2006, 4pp.

Paul B.C. et al., "Impact of a Process Variation on Nanowire and Nanotube Device Performance," IEEE Transactions on Electron Devices 54:9 Sep. 2007, pp. 2369-2376.

Wang H-H et al., "A New Read-Disturb Failure Mechanism Caused by Boosting Hot-Carrier Injection Effect in MLC NAND Flash Memory," IEEE International Memory Workshop, 2009, May 10-14, 2009, pp. 1-2.

* cited by examiner

Timing of WL driver circuitry

| Operation | | SEL | SELB | VPWR | VNP | VPP | SELHB | SELH |
|---|---|---|---|---|---|---|---|---|
| Program | Select | VDD | 0 | VDD | 0 | 30 | 0 | 30 |
| | Deselect | 0 | VDD | VDD | 0 | 30 | VDD | 0 |
| Erase | Select | 0 | VDD | 2 | -15 | 10 | 2 | -15 |
| | Deselect | VDD | 0 | 2 | -15 | 10 | -15 | 10 |
| Read | Select | VDD | 0 | VDD | 0 | 8 | 0 | 8 |
| | Deselect | 0 | VDD | VDD | 0 | 8 | VDD | 0 |

Fig. 15

WORD LINE DRIVER CIRCUIT FOR SELECTING AND DESELECTING WORD LINES

CROSS-REFERENCE TO RELATED APPLICATIONS

This application claims the benefit of U.S. Provisional Patent Application No. 61/775,723, filed 11 Mar. 2013.

BACKGROUND

1. Field of the Invention

This technology relates to word line driver circuitry.

2. Description of Related Art

In one traditional memory design, deselected word lines that are not selected for erase, is left floating throughout the period from receiving the erase command, until completion of the erase operation. In this design, the deselected word line is subject to erase disturb from proximate selected word lines that are selected for erase.

It would be desirable to address erase disturb of deselected word lines.

In another traditional memory design, a word line is selected or deselected as in U.S. Pat. No. 5,801,991, column 9, lines 40-54. In this design, the logic for coupling the word line to various voltages is located away from the word line driver and associated output circuitry, and located with the row decoder or even further from the word line. Such logic complicates the signals which control the word line driver.

It would be desirable to solve the problem of positioning the logic for coupling the word line to various voltages.

SUMMARY

One aspect of the technology is an apparatus including a memory circuit, comprising: a plurality of word lines coupled to a memory array, and control circuitry. The plurality of word lines includes a first set of one or more word lines deselected in an erase operation, and a second set of one or more word lines selected in the erase operation. The control circuitry couples the first set of one or more word lines deselected in the erase operation to a reference voltage, responsive to receiving an erase command for the erase operation.

Another aspect of the technology is a method of operating a memory, comprising:

responsive to receiving an erase command for the erase operation, coupling a reference voltage to a first set of one or more word lines of a plurality of word lines coupled to a memory array, the first set of one or more word lines deselected in the memory operation.

In one embodiment, the control circuitry performs, responsive to receiving the erase command for the erase operation, after a precharge of the first set of one or more word lines to the reference voltage, floating the first set of one or more word lines prior to erasing the second set of one or more word lines.

In one embodiment, the control circuitry performs, responsive to receiving the erase command for the erase operation, after a time interval following a precharge of the first set of one or more word lines to the reference voltage, further charging the first set of one or more word lines from the reference voltage to a boosted voltage.

Several embodiments of the technology further include a first transistor that switchably couples a word line in the plurality of word lines to a global word line, and a second transistor that switchably couples the word line to a ground voltage. The control circuitry is coupled to the first transistor and the second transistor. The control circuitry has a plurality of modes in at least an erase operation. In a first mode, the first transistor couples the word line in the plurality of word lines to the global word line, and the second transistor decouples the word line from the ground voltage. In a second mode, the first transistor decouples the word line in the plurality of word lines from the global word line, and the second transistor couples the word line to the ground voltage.

In one embodiment of the technology, for the erase operation, the mode switches depending on whether the word line in the plurality of word lines is selected or deselected. Responsive to the word line in the plurality of word lines being selected for the erase operation, the control circuitry is in one of the first mode and the second mode with respect to the word line in the plurality of word lines, and responsive to the word line in the plurality of word lines being deselected for the erase operation, the control circuitry is in another of the first mode and the second mode with respect to the word line in the plurality of word lines.

In one embodiment of the technology, for the same word line in the plurality of word lines being selected, the mode switches depending on different operation types. Responsive to the word line in the plurality of word lines being selected for a first operation type, the control circuitry is in one of the first mode and the second mode with respect to the word line in the plurality of word lines, and responsive to the word line in the plurality of word lines being selected for a second operation type different from the first operation type, the control circuitry is in another of the first mode and the second mode with respect to the word line in the plurality of word lines.

In one embodiment of the technology, for the same word line in the plurality of word lines being deselected, the mode switches depending on different operation types. Responsive to the word line in the plurality of word lines being deselected for a first operation type, the control circuitry is in one of the first mode and the second mode with respect to the word line in the plurality of word lines, and responsive to the word line in the plurality of word lines being deselected for a second operation type different from the first operation type, the control circuitry is in another of the first mode and the second mode with respect to the word line in the plurality of word lines.

In one embodiment of the technology, responsive to the word line in the plurality of word lines being selected for an erase operation, the control circuitry is in the second mode with respect to the word line in the plurality of word lines.

In one embodiment of the technology, responsive to the word line in the plurality of word lines being deselected for an erase operation, the control circuitry is in the first mode with respect to the word line in the plurality of word lines.

In one embodiment of the technology, responsive to the word line in the plurality of word lines being selected for a non-erase operation, the control circuitry is in the first mode with respect to the word line in the plurality of word lines.

In one embodiment of the technology, responsive to the word line in the plurality of word lines being deselected for a non-erase operation, the control circuitry is in the second mode with respect to the word line in the plurality of word lines.

One embodiment of the technology further includes a level shifter. The first set of transistors and the second set of transistors are controlled by the control circuitry via the level shifter.

One embodiment of the technology further includes logic circuitry coupling a decoder output to the level shifter. The logic circuitry provides an input to the level shifter which corresponds to an exclusive or operation between the decoder output and an operation indicator The operation indicator is high responsive to a present operation being erase and the operation indicator is low responsive to the present operation being non-erase.

BRIEF DESCRIPTION OF THE DRAWINGS

FIG. 15 shows a table of node voltages for the improved high voltage switch of FIG. 11.

DETAILED DESCRIPTION

Figure 1:
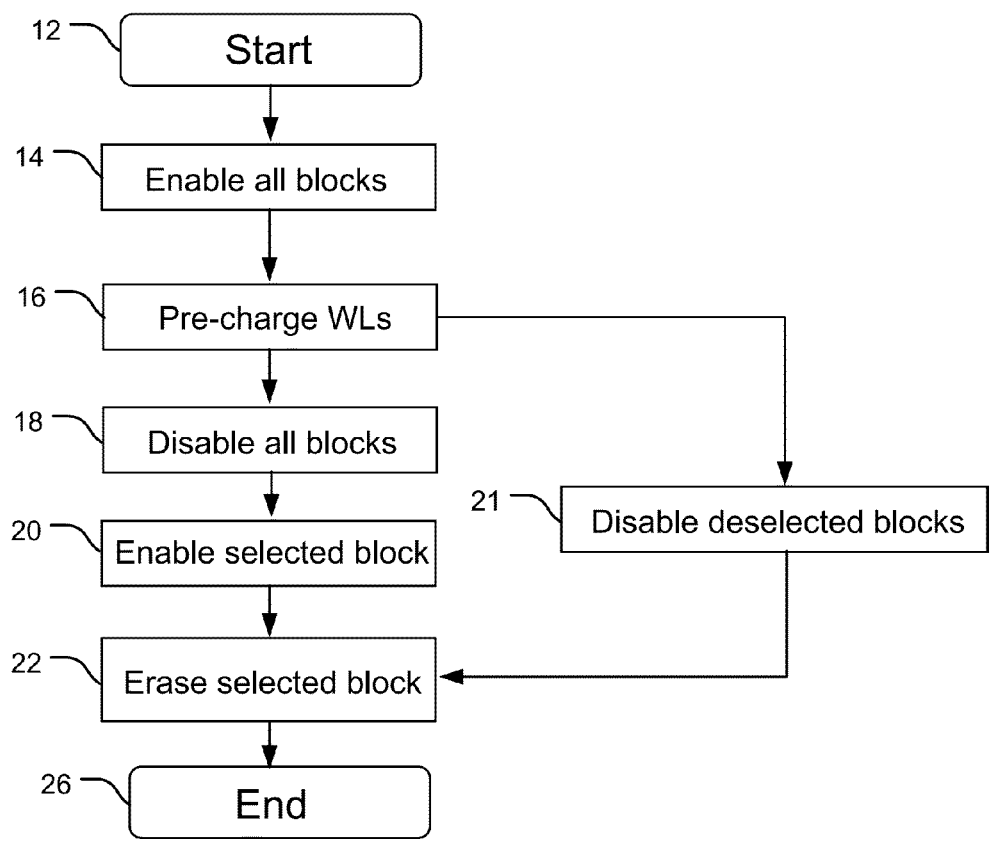
FIG. 1 is a process flow for erasing nonvolatile memory after pre-charging word lines of memory blocks that are selected and deselected for erase.

FIG. 1 is a process flow for erasing nonvolatile memory after pre-charging word lines of memory blocks that are selected and deselected for erase.

In step 12, the process flow starts. In step 14, all memory blocks are enabled. In some embodiments, with an enabled memory block, the word lines are electrically coupled to the global word line or a reference voltage. The enabled memory blocks include both memory blocks selected for a memory operation such as erase, and memory blocks deselected for an operation such as erase.

In step 16, the words lines of all the memory blocks enabled from the prior step 14 are pre-charged. For example, the word lines of the enabled memory blocks are charged to a high voltage, prior to performing the actual memory operation.

Two embodiments are shown. One embodiment continues after step 16 with step 18, in which all the memory blocks enabled in step 14 are disabled. In some embodiments, with a disabled memory block, the word lines are electrically decoupled from the global word line or reference voltage.

In step 20, the memory block selected by the memory address decoder is enabled. The word line of the memory block is electrically coupled to the global word line or reference voltage.

Another embodiment continues after step 16 with step 21, in which deselected blocks are disabled. Because prior step 14 enabled all blocks, the remaining enabled blocks are only the selected blocks.

Both embodiments continue with step 22, in which the selected memory block which was enabled in step 20, or left enabled in step 21, is erased. The global word line or reference voltage applies an erase voltage to the word line of the selected memory block. In step 26, the process flow ends.

Figure 2:
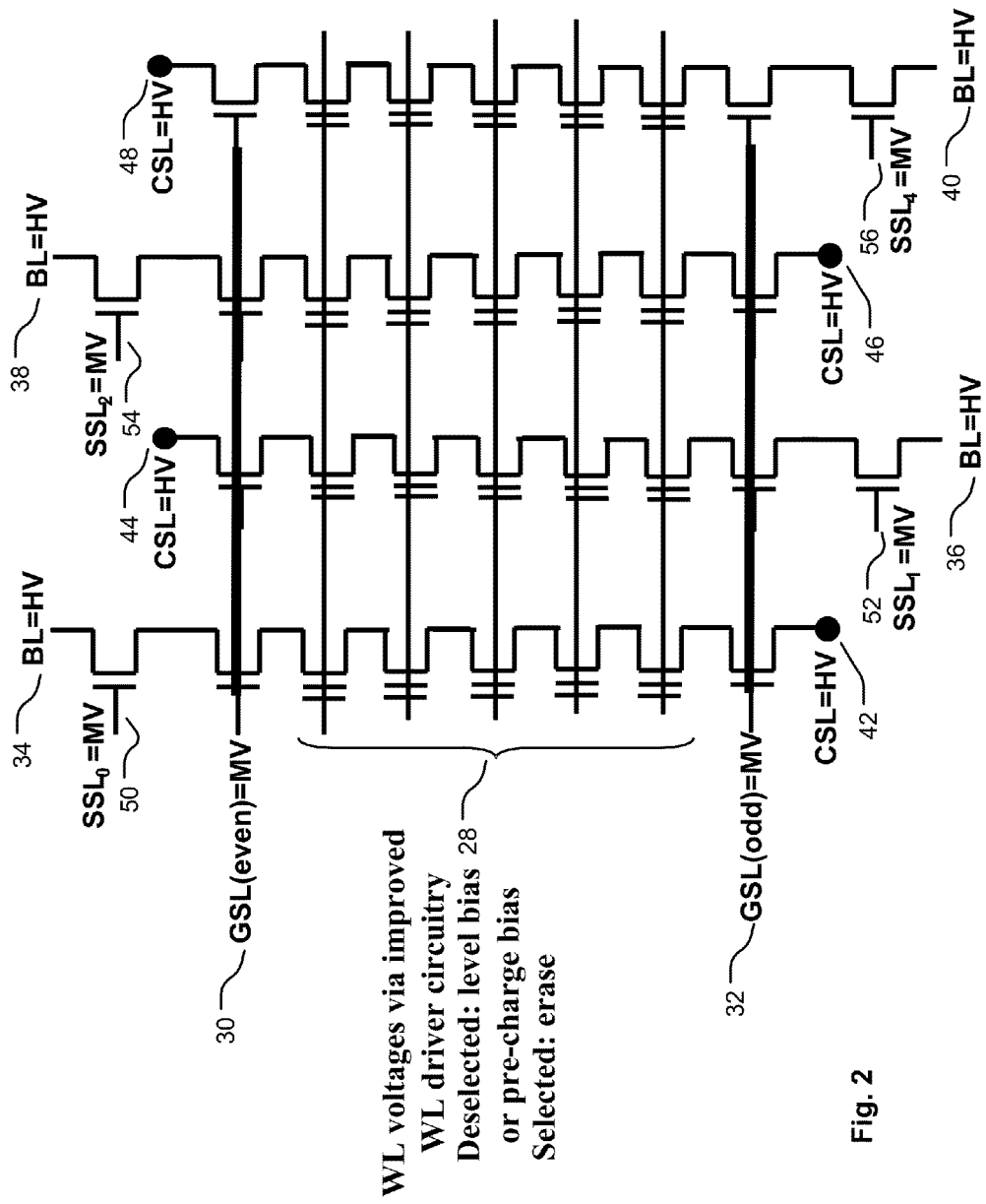
FIG. 2 shows a circuit diagram of nonvolatile memory, including memory cells, along with word lines, bit lines, and other circuitry to access the memory cells.

FIG. 2 shows a circuit diagram of nonvolatile memory, including memory cells, along with word lines, bit lines, and other circuitry to access the memory cells.

Figure 4:
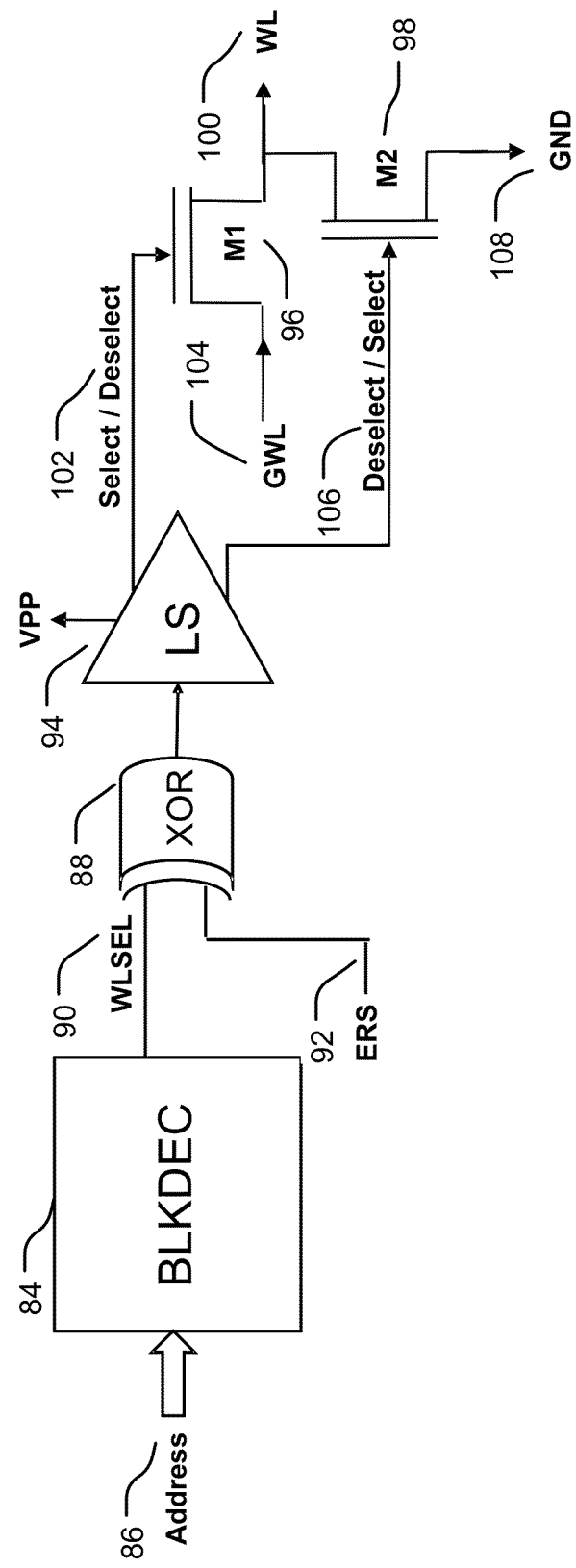
FIG. 4 shows a block diagram of word line driver circuitry that controls whether a word line is selected or deselected.
Figure 7:
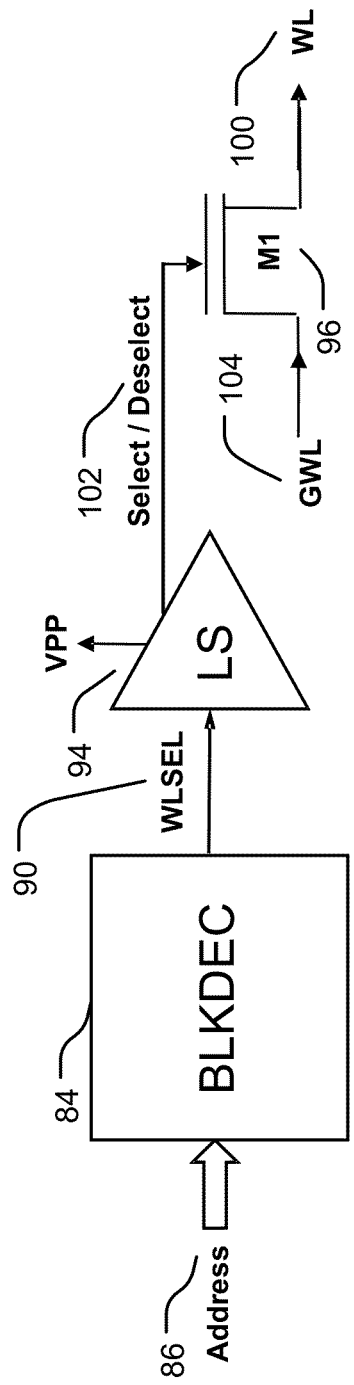
FIG. 7 shows a block diagram of word line driver circuitry that controls whether a word line is selected or deselected.

Word lines 28 access a memory array. The word lines 28 are pre-charged prior to a memory operation. The pre-charging occurs via word line driver circuitry, such as shown in FIG. 4 or FIG. 7. For an erase operation, the deselected word lines are pre-charged to a high voltage, or alternatively a level bias is applied to the deselected word lines. The selected word line is coupled to a reference voltage such as ground, to maximize the voltage difference between (i) the word line and (ii) the bit line coupled to the substrate.

The word lines 28 are bounded by an even ground select line 30 above and an odd ground select line 32 below.

The memory strings are shown in alternating orientations of bit line-common source line and common source line-bit line. In one embodiment, the claimed technology applies to three-dimensional nonvolatile memory arrays, and in another embodiment, the claimed technology applies to two-dimensional nonvolatile memory arrays. The claimed technology is particularly useful with three-dimensional nonvolatile memory arrays, because of the lower capacitive coupling ratio between the word line, and substrate or bit line associated with three-dimensional nonvolatile memory arrays.

Four memory strings are shown. From left to right, the memory strings include: bit line 34 to common source line 42, common source line 44 to bit line 36, bit line 38 to common source line 46, and common source line 48 to bit line 40. In each memory string, a string select transistor is in between the bit line and the ground select transistor. Each memory string includes a string select transistor, which are, in order from the far left memory string to the far right memory string, string select transistor 50, string select transistor 52, string select transistor 54, and string select transistor 56.

Figure 3:
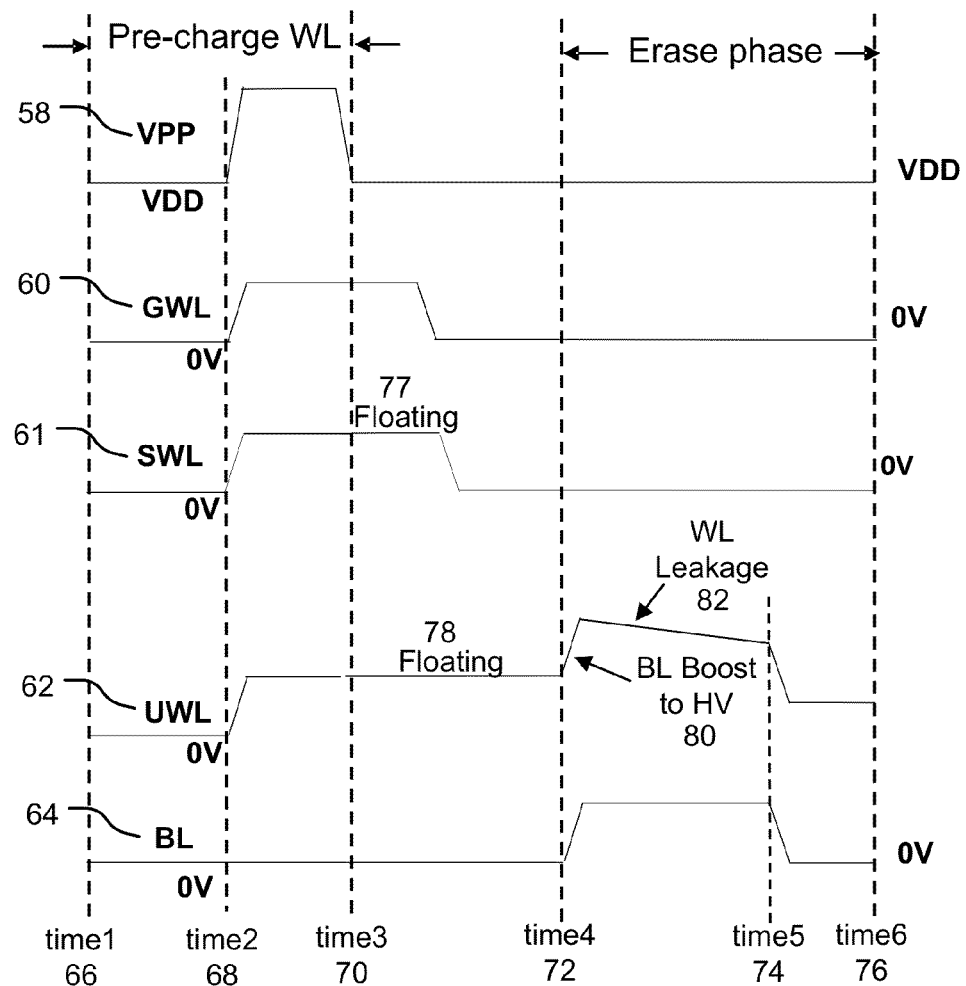
FIG. 3 shows a timing diagram of the access circuitry for nonvolatile memory.

FIG. 3 shows a timing diagram of the access circuitry for nonvolatile memory.

The following traces are shown in the timing diagram:

(i) VPP 58, the high voltage applied to the level shifter. The level shifter is between the row decoder and the transistors that electrically couple the global word line to the local word lines.

(ii) GWL 60, the global word line. The global word line is electrically coupled to local word lines, to apply operation voltages to memory cells.

(iii) SWL 61, a selected word line. A selected word line is electrically coupled to a global word line during a memory operation.

(iv) UWL 62, an unselected word line. An unselected word line is electrically decoupled from a global word line or reference voltage during a memory operation.

(v) BL 64, a bit line. The bit line controls the substrate voltage of transistors when the string select transistors electrically couple the bit line to the memory string.

Between time1 66 and time2 68, VPP 58 is low, prior to the actual pre-charge step.

Between time2 68 and time3 70, VPP 58 is high, which results in the level shifter causing the GWL 60 to pre-charge the SWL 61 and UWL 62.

Between time3 70 and time4 72, VPP 58 is low, which results in the level shifter electrically decoupling the GWL 60 from the SWL 61 and UWL 62, resulting in SWL 61 floating 77, and UWL 62 floating 78. Because the GWL 60 is electrically decoupled from the UWL 62, when GWL 60 goes low, UWL 62 remains high.

Between time4 72 and time5 74, the erase operation is performed with SWL 61. BL 64 goes high, raising the substrate voltage relative to the word lines. Because of capacitive coupling between the bit lines and the floating word lines, the increase in BL 64 results in an increase in UWL 62 due to BL boost 80. Then, the UWL 62 slowly decreases due to leakage from the floating word line.

Between time5 74 and time6 76, UWL 62 goes low and BL 64 goes low, prior to a subsequent operation (not shown).

FIG. 4 shows a block diagram of word line driver circuitry that controls whether a word line is selected or deselected.

Block decoder BLKDEC 84 receives a row address 86, and outputs word line select WLSEL 90. Combinational logic such as XOR gate 88 receives the word line select WLSEL 90 and erase ERS 92. Another embodiment includes state logic such as flip flops to supplement or replace the combinational logic 88. Word line select WLSEL 90 goes high to select a particular memory block. Erase ERS 92 is high for the erase operation and low for non-erase operations such as program or read.

The level shifter LS 94 receives the output of combinational logic 88. The level shifter LS 94 has a high voltage VPP. If just one of word line select WLSEL 90 and erase ERS 92 is high, then signal 102 is select; otherwise signal 102 is deselect. If just one of word line select WLSEL 90 and erase ERS 92 is high, then signal 106 is deselect; otherwise signal 106 is select.

If signal 102 is select, then transistor M1 96 electrically couples the global word line GWL 104 to word line WL 100. If signal 102 is deselect, then transistor M1 96 electrically decouples the global word line GWL 104 from word line WL 100.

If signal 106 is deselect, then transistor M2 98 electrically decouples the word line WL 100 from the reference voltage ground GND 108. If signal 106 is select, then transistor M2 98 electrically couples the word line WL 100 to the reference voltage ground GND 108.

Figure 5:
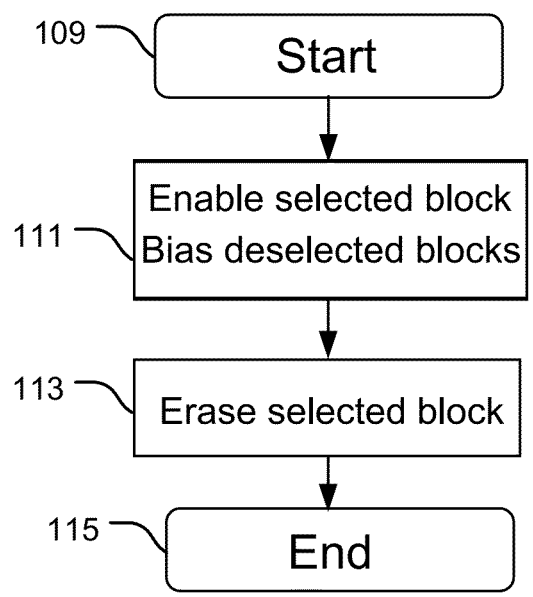
FIG. 5 is a process flow for erasing nonvolatile memory while biasing word lines of memory blocks that are deselected for erase.

FIG. 5 is a process flow for erasing nonvolatile memory while biasing word lines of memory blocks that are deselected for erase.

In step 109, the process flow starts. In step 111, selected memory blocks are enabled and deselected blocks are biased to a level voltage rather than left floating. In some embodiments, with an enabled memory block, the word lines are electrically coupled to the global word line or a reference voltage.

In step 113, the selected memory block which was enabled in step 111 is erased. The global word line or reference voltage applies an erase voltage to the word line of the selected memory block. In step 115, the process flow ends.

Figure 6:
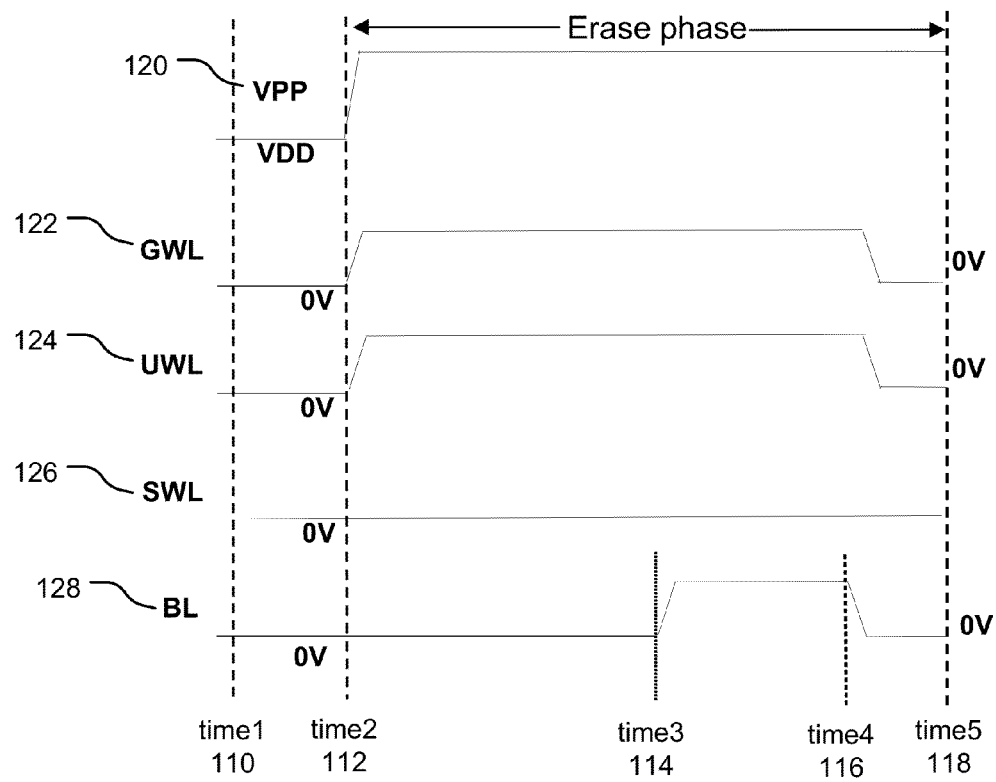
FIG. 6 shows a timing diagram of the access circuitry for nonvolatile memory.

FIG. 6 shows a timing diagram of the access circuitry for nonvolatile memory.

The following traces are shown in the timing diagram:

(i) VPP 120, the high voltage applied to the level shifter. The level shifter is between the row decoder and the transistors that electrically couple the global word line to the local word lines.

(ii) GWL 122, the global word line. The global word line is electrically coupled to local word lines, to apply operation voltages to memory cells.

(iii) UWL 124, an unselected word line. An unselected word line is electrically decoupled from a global word line or reference voltage during a memory operation.

(iv) SWL 126, a selected word line. A selected word line is electrically coupled to a global word line or reference voltage during a memory operation.

(v) BL 128, a bit line. The bit line controls the substrate voltage of transistors when the string select transistors electrically couple the bit line to the memory string.

Between time1 110 and time2 112, VPP 120 is low, prior to the erase step.

Between time2 112 and time5 118, VPP 120 is high, which results in the level shifter causing the GWL 122 to charge the UWL 124.

Between time3 114 and time4 116, the erase operation is performed with SWL 126. BL 128 goes high, raising the substrate voltage relative to the word lines.

Between time4 116 and time5 118, UWL 124 goes low and BL 128 goes low, prior to a subsequent operation (not shown).

FIG. 7 shows a block diagram of word line driver circuitry that controls whether a word line is selected or deselected.

Block decoder BLKDEC 84 receives a row address 86, and outputs word line select WLSEL 90.

The level shifter LS 94 receives the word line select WLSEL 90. If word line select WLSEL 90 is high, then signal 102 is select; otherwise signal 102 is deselect.

If signal 102 is select, then transistor M1 96 electrically couples the global word line GWL 104 to word line WL 100. If signal 102 is deselect, then transistor M1 96 electrically decouples the global word line GWL 104 from word line WL 100.

Figure 8:
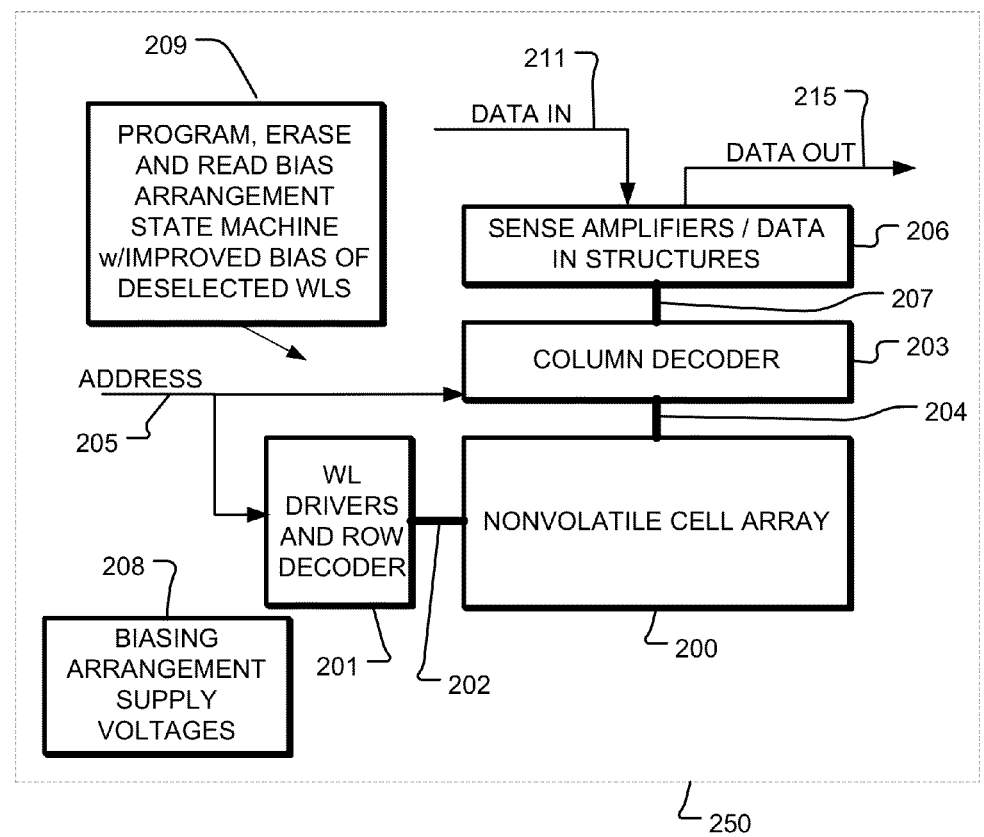
FIG. 8 is a block diagram of an integrated circuit including an array of nonvolatile memory cells, and other circuitry including improved word line driver circuitry.

FIG. 8 is a block diagram of an integrated circuit including an array of nonvolatile memory cells, and other circuitry including improved word line driver circuitry.

The integrated circuit 250 includes a memory array 200 implemented using NAND memory cells. Addresses are supplied on bus 205 to column decoder 203 and row decoder 201 which includes the improved word line drivers and row decoder circuitry. Sense amplifiers and data-in structures in block 206 are coupled to the column decoder 203 via data bus 207. Data is supplied via the data-in line 211 from input/output ports on the integrated circuit 250, or from other data sources internal or external to the integrated circuit 250, to the data-in structures in block 206. Data is supplied via the data-out line 215 from the block 206 to input/output ports on the integrated circuit 250, or to other data destinations internal or external to the integrated circuit 250. The integrated circuit 250 may also include circuitry directed a mission function other than the nonvolatile storage.

A controller implemented in this example using bias arrangement state machine 209 controls the application of bias arrangement supply voltages 208, such as read, program, erase, erase verify and program verify voltages. The controller 209 also applies the improved bias scheme of deselected word lines responsive to an erase command. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 9:
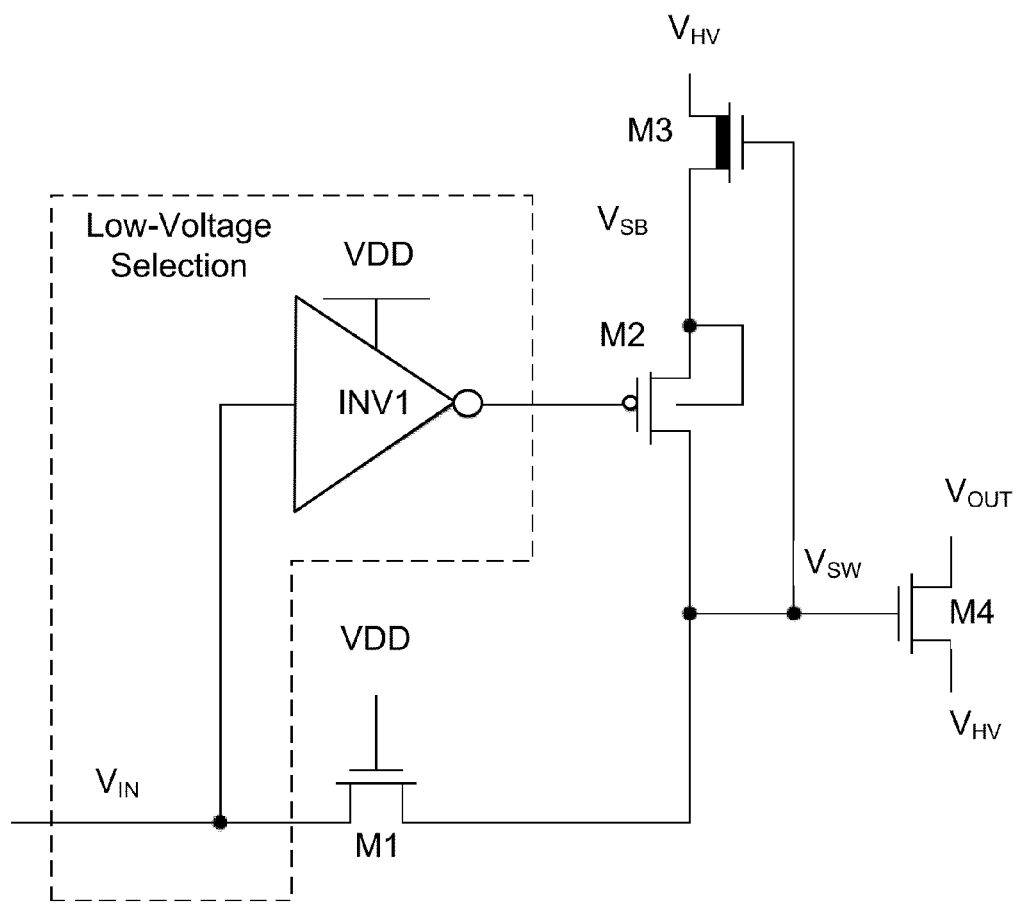
FIGS. 9-14 various high voltage switches that control the word line driver circuitry.

FIG. 9 shows a high voltage switch used in NAND Flash memory. This figure helps to explain subsequent figures.

M3 is a depletion NMOS transistor. The threshold voltages of M2 and M3, in one example, are −1 V and −0.8 V respectively. In one case Vin is low and Vsw=GND ground. M2 is off and Vsb is equal to 0.8 V (M3 has a negative Vth threshold voltage).

M4 is off and Vout is independent of Vhv. When Vin approaches Vdd, M2 turns on, raising the voltage of node Vsw. Transistor M1 contributes to the rise of Vsw until Vsw equals VDD−Vth, M1. At this point, M1 is diode-connected and isolates the low-voltage section of the circuit, indicated as the inverter INV1. The positive feedback between nodes Vsb and Vsw (through M2 and M3) takes voltage Vsw to the value Vhv.

Figure 10:
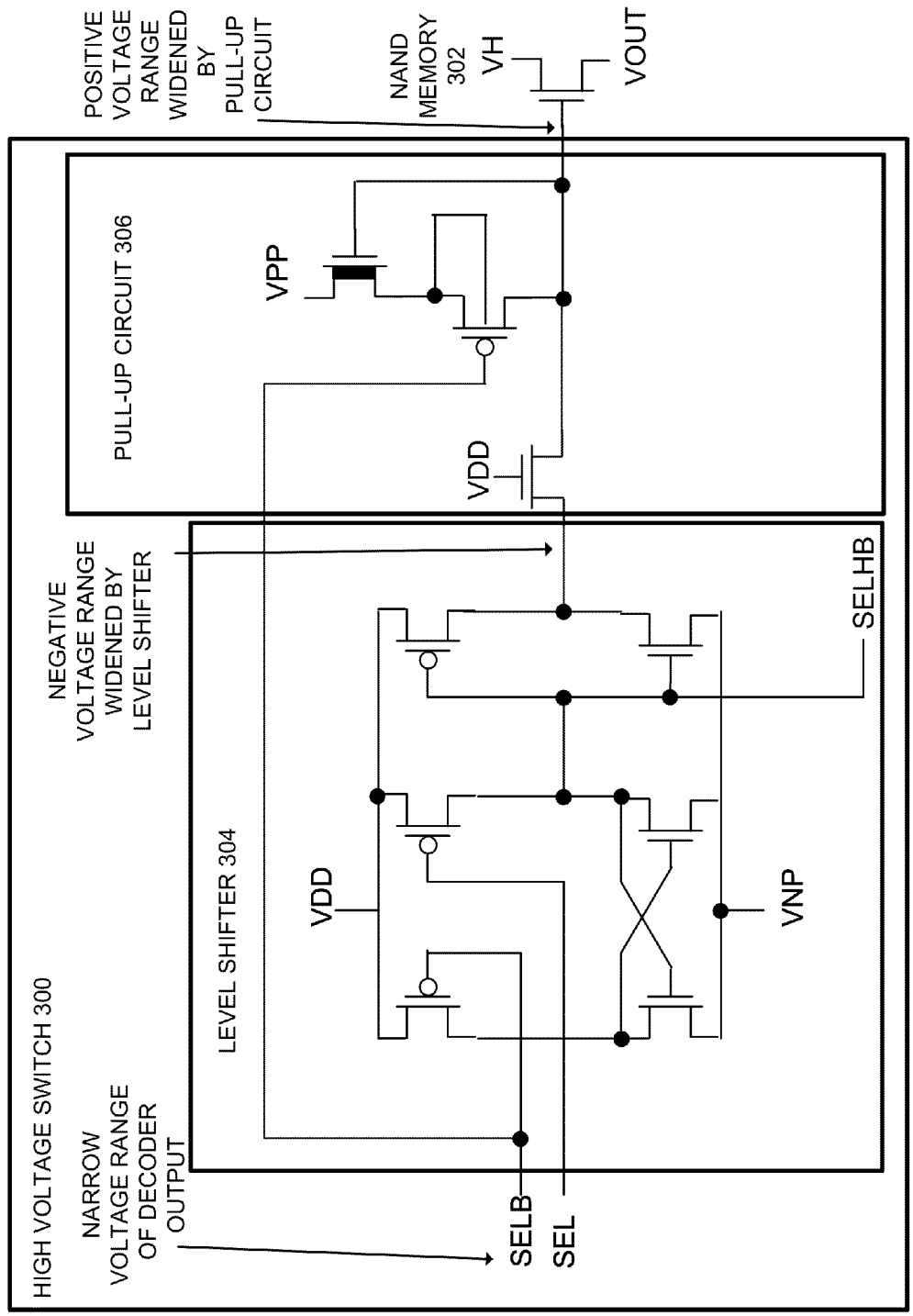

FIG. 10 shows an improved high voltage switch, or high voltage switch.

The improved high voltage switch 300 is capable of providing to the NAND memory 302, a negative voltage input to turn off a NAND memory block. With this circuit, the previously described problem will not happen, of mistakenly enabled memory blocks in the NAND array. Accordingly, the improved high voltage switch, or high voltage switch, can provide a negative voltage to turn off deselected memory blocks.

VNP is the most negative voltage of the chip during operation. VPP is the most positive voltage of the chip during operation.

The high voltage switch 300 includes a level shifter 304 and a pull-up circuit 306. The input of the high voltage switch 300 is a SEL signal from the decoder enabling/disabling a memory block of the NAND array.

The level shifter 304 resembles cross-coupled inverters, in that there are two pairs of p-type and n-type transistors that are series connected between a high VDD voltage reference and a low VNP voltage reference, and the gate of each n-type transistor is cross-coupled to the drain of the other n-type transistor. However, unlike an inverter, the gates of the p-type transistors are respectively coupled to the SEL signal from the decoder enabling/disabling a memory block, and the complement signal SELB. The output is an internal node of one of the series connected pair of p-type and n-type transistors. In the shown embodiment, the output is the internal node of one of the series connected pair of p-type and n-type transistors, including the p-type transistor with a gate receiving the SEL signal from the decoder enabling/disabling a memory block. This output is further processed by an inverter. The output of the level shifter 304 has a negative voltage range widened by the level shifter 304, to include VNP.

The pull-up circuit 306 has an optional n-type transistor connecting the level shifter output with the primary part of the pull-up circuit 306, which is identical to an x-decoder or row decoder circuit. An n-type depletion mode transistor is series connected with a p-type transistor between VPP and the high voltage switch output. The n-type depletion mode transistor has a gate connected to the high voltage switch output, a drain connected to VPP, and a source connected to the source of the p-type transistor. The p-type transistor has a drain connected to the high voltage switch output, and a gate connected to the decoder signal SELB.

More generally, a pull-up circuit such as an x-decoder or row decoder circuit receives an enable/disable signal and a complement of the enable/disable signal. In response to the enable signal, the pull-up circuit outputs a larger voltage than the enable signal (such as VPP). In response to the disable signal, the pull-up circuit outputs the disable signal.

In the high voltage switches described by FIGS. 10-14, a level shifter stage is followed by a decoder stage. The negative voltage shifter stage outputs the signals with an expanded negative voltage range, and the decoder stage outputs the signals with expanded positive voltage range.

The level shifter stage receives as input the block select SEL signal. In many embodiments the block select SEL signal has, as is common with logical circuit outputs, a single polarity (negative or positive), commonly positive. The block select SEL signal therefore commonly has values of the decoder output, such as logical values of VDD or ground. After the level shifter stage receives the block select SEL signal, the level shifter stage outputs a signal between the wider range of VDD and VNP. The level shifter stage widens the lower voltage range from GND to a negative VNP.

The decoder stage widens the signal range from VDD and VNP, to VPP and VNP. Whereas the maximum voltage of the level shifter stage was VDD, corresponding to the logical circuit output maximum, the maximum voltage of the decoder stage is VPP, which is higher than VDD.

Figure 11:
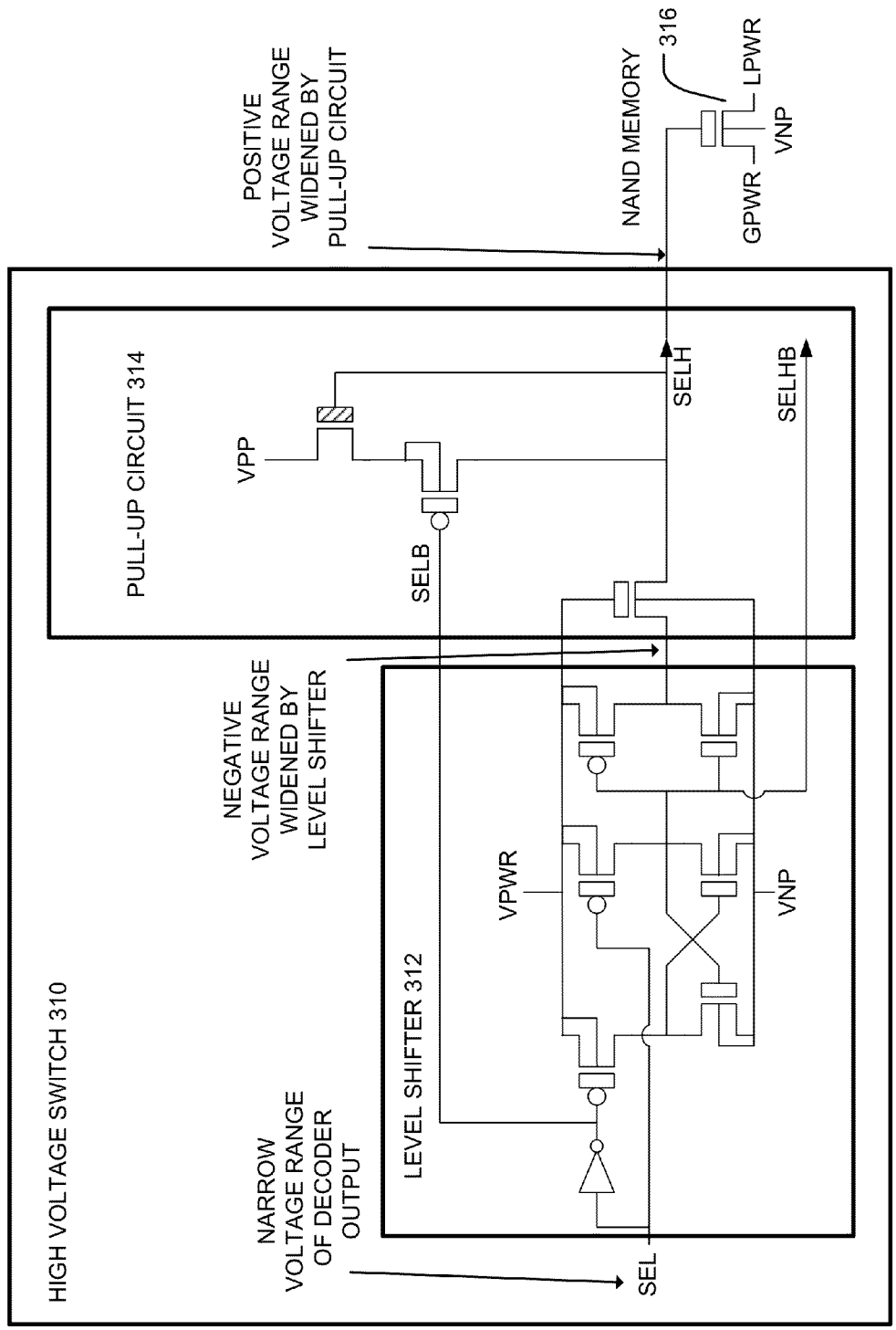

FIG. 11 shows another improved high voltage switch, or high voltage switch.

The high voltage switch 310 includes a level shifter 312 followed by a pull-up circuit 314. The high voltage switch 310 is followed by a transistor 316 which is series-connected with NAND strings. The NAND memory block is enabled or disabled as described above in connection with the above figures, depending on whether the voltage switch received a high or low block select signal.

In comparison with FIG. 10, the high voltage switch 310 of FIG. 11 shows an inverter that receives the decoder signal SEL and generates the complement of the decoder signal SELB. The complement of the decoder signal can be generated by the decoder, or subsequently, as in FIG. 11.

Figure 12:
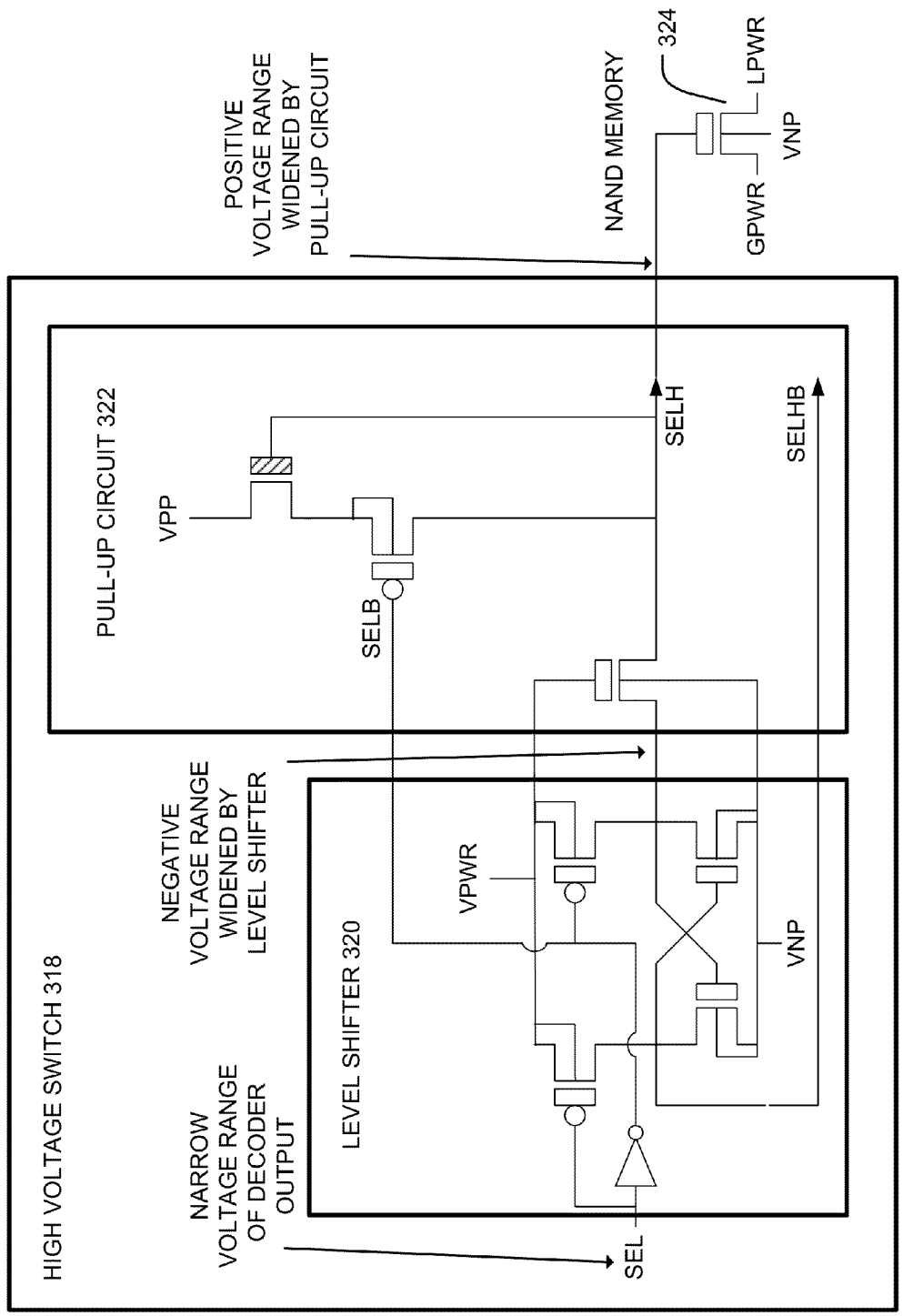

FIG. 12 shows another improved high voltage switch, or high voltage switch.

The high voltage switch 318 includes a level shifter 320 followed by a pull-up circuit 322. The high voltage switch 318 is followed by a transistor 324 which is series-connected with NAND strings. The NAND memory block is enabled or disabled as described above in connection with the above figures, depending on whether the voltage switch received a high or low block select signal. In contrast with FIG. 11, the input of the high voltage switch 318 has reversed polarities of the block select SEL and block select bar SELB signals at the beginning Because of the reversed polarities, an inverter is removed from the level shifter of the high voltage switch.

Figure 13:
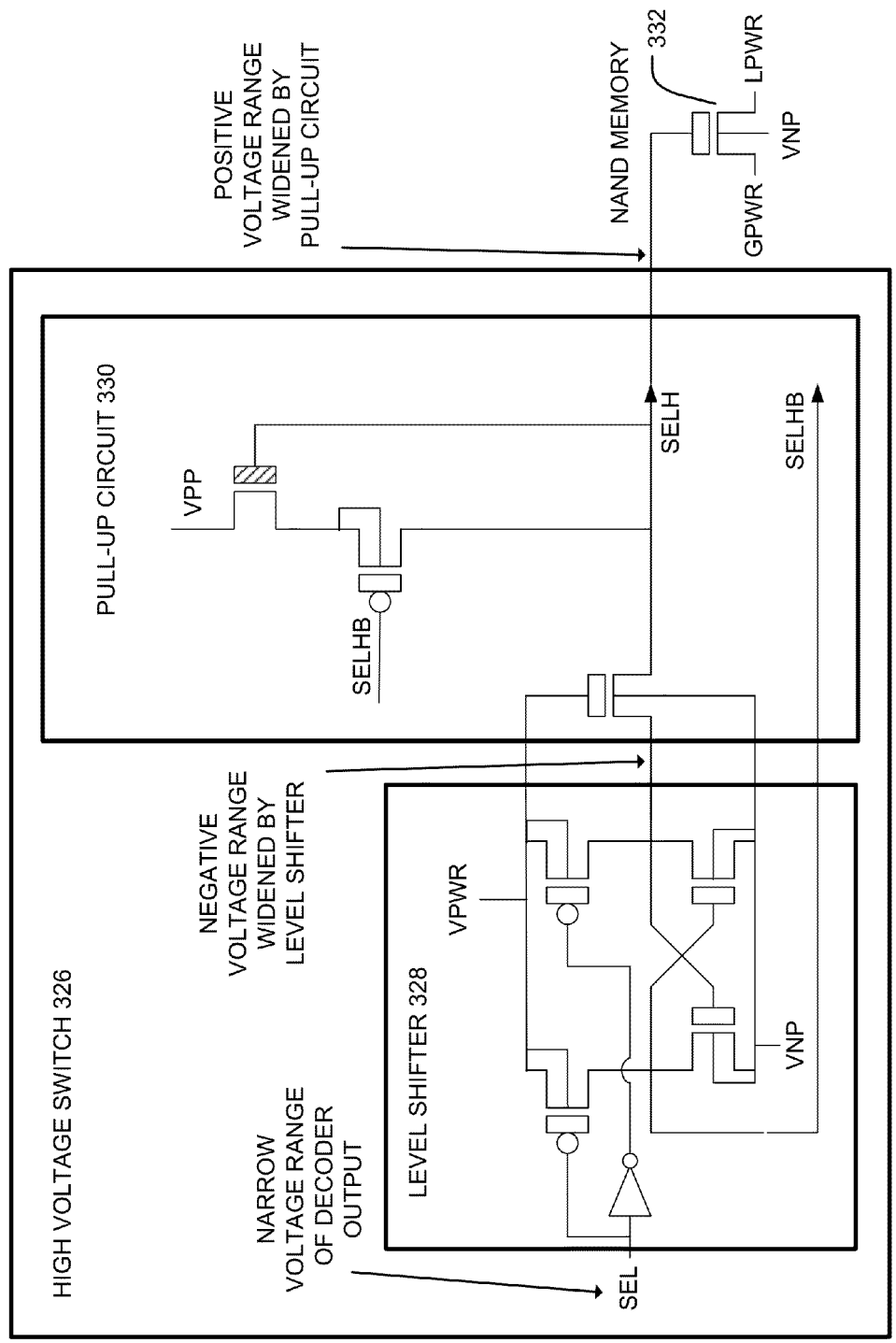

FIG. 13 shows another improved high voltage switch, or high voltage switch.

The high voltage switch 326 includes a level shifter 328 followed by a pull-up circuit 330. The high voltage switch 326 is followed by a transistor 332 which is series-connected with NAND strings. The NAND memory block is enabled or disabled as described above in connection with the above figures, depending on whether the voltage switch received a high or low block select signal.

In contrast with FIGS. 11 and 12, in FIG. 13 the gate of the p-type transistor in the pull-up circuit 330 of the high voltage switch 326 is coupled to neither the decoder output block select SEL signal nor its complement the block select bar SELB signal. Instead, the gate of the p-type transistor in the pull-up circuit 330 of the high voltage switch 326 is coupled to the SELHB signal, which in turn is coupled through an n-type transistor to VNP, the negative voltage reference of the level shifter 328. The SELH signal output and the SELHB signal are on different nodes within the level shifter 328.

Figure 14:
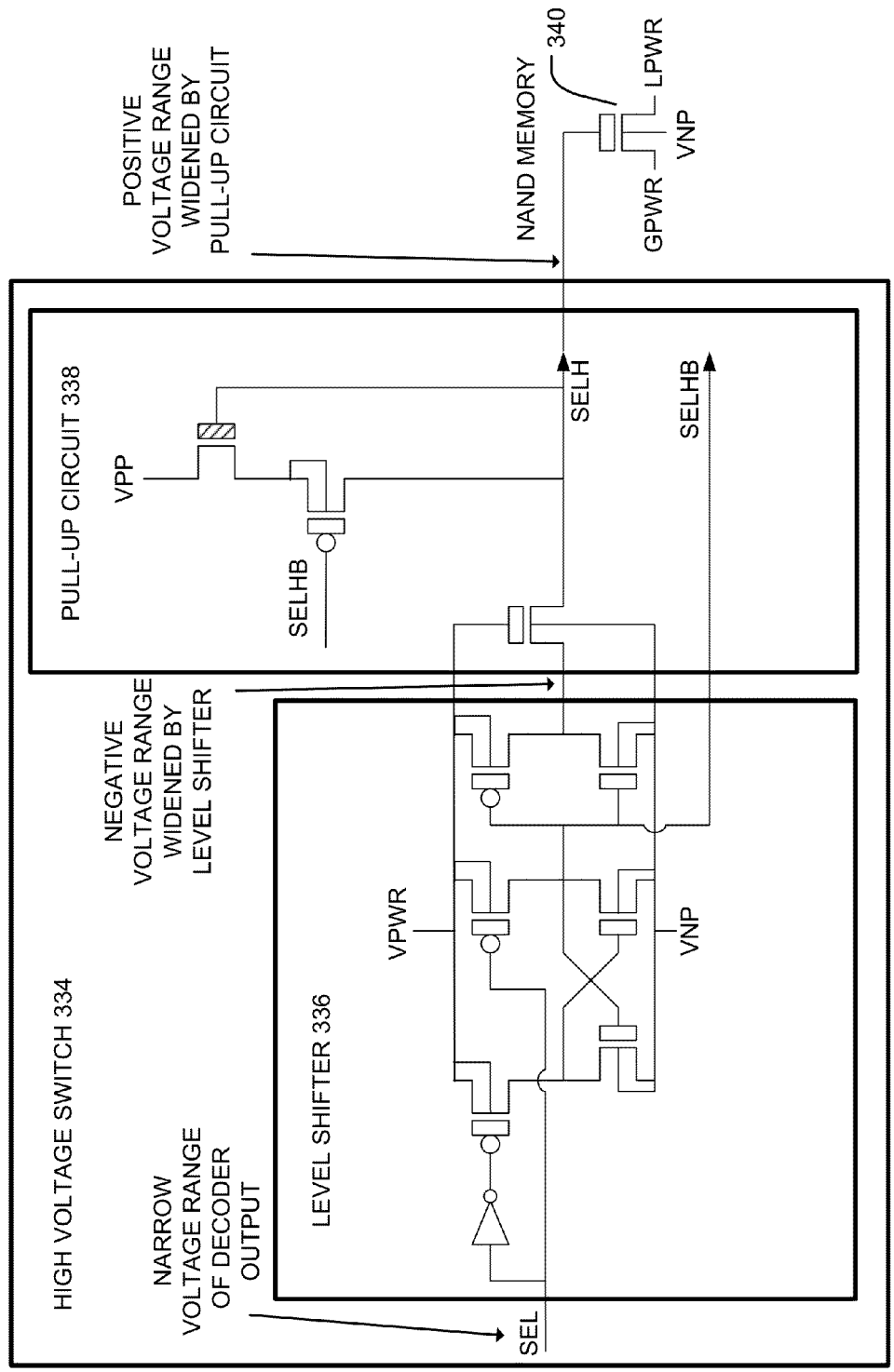

FIG. 14 shows another improved high voltage switch, or high voltage switch.

The high voltage switch 334 includes a level shifter 336 followed by a pull-up circuit 338. The high voltage switch 334 is followed by a transistor 340 which is series-connected with NAND strings. The NAND memory block is enabled or disabled as described above in connection with the above figures, depending on whether the voltage switch received a high or low block select signal.

In contrast with FIG. 13, the input of the high voltage switch 334 has reversed polarities of the block select SEL and block select bar SELB signals at the beginning Because of the reversed polarities, an inverter is added to the level shifter 336 of the high voltage switch 334.

FIG. 15 shows a table of node voltages for the circuit of FIG. 11, varying with different operations (read, erase, program) and with different block select status (select, deselect).

The table in FIG. 15 shows that the input of the high voltage switch, the signal SEL, and its complement SELB, have logical signal values of 0 and VDD. The purpose of the high voltage switch is to widen the voltage range of these signals sufficiently to select and deselect blocks of the memory array. The level shifter of the high voltage switch widens the voltage range to include VNP, the negative voltage reference of the level shifter. The pull-up circuit widens the voltage range to include VPP, the positive voltage reference of the pull-up circuit. Accordingly, the high voltage switch widens the voltage range of the signals from a relatively narrow range of 0 to VDD, to a relatively wide range of VNP and VPP.

In embodiments where VPP is higher than VDD, the transistor area is smaller.

The table shows that the operation requirement of NMOS transistors is higher than the operation requirement of PMOS transistors. In the shown table, the NMOS operation requirement is 30V (for example, VPP−SELH or VPP−SELHB). In the shown table, the PMOS operation requirement is 17V (for example, SELHB−SELH).

This reduced PMOS operation requirement results from the additional decoder stage between the negative level shifter stage and the NAND array. Such a reduced PMOS operation requirement reduces the area requirement of the PMOS transistors.

The NMOS/PMOS transistors sustain high voltage operation between VPWR & VNP. The total working range is limited by the NMOS. In some embodiments, this switch has outputs ranges of: −15~10V (Erase) and 0~30 V (Program).

Some embodiments generate, at the same time, a high magnitude positive voltage without a high magnitude negative voltage, and/or a high magnitude negative voltage without a high magnitude positive voltage. This feature reduces the area requirement of the transistors.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory circuit, comprising:
a plurality of word lines coupled to a memory array, including:
a first set of one or more word lines deselected in an erase operation; and
a second set of one or more word lines selected in the erase operation; and
control circuitry coupling the first set of one or more word lines deselected in the erase operation to a reference voltage, responsive to receiving an erase command for the erase operation, wherein the control circuitry performs:
after a precharge of the first set of one or more word lines to the reference voltage, floating the first set of one or more word lines.

2. The memory circuit of claim 1, wherein the control circuitry performs:
responsive to receiving the erase command for the erase operation, after the precharge of the first set of one or more word lines to the reference voltage, performing said floating the first set of one or more word lines prior to erasing the second set of one or more word lines.

3. The memory circuit of claim 1, wherein the control circuitry performs:
responsive to receiving the erase command for the erase operation, after a time interval following the precharge of the first set of one or more word lines to the reference voltage, further charging the first set of one or more word lines from the reference voltage to a boosted voltage.

4. The memory circuit of claim 1, further comprising:
a first transistor switchably coupling a word line in the plurality of word lines to a global word line;
a second transistor switchably coupling the word line in the plurality of word lines to a ground voltage,
wherein the control circuitry is coupled to the first transistor and the second transistor, wherein the control circuitry has a plurality of modes in at least the erase operation, including:
a first mode in which the first transistor couples the word line in the plurality of word lines to the global word line, and in which the second transistor decouples the word line from the ground voltage; and
a second mode in which the first transistor decouples the word line in the plurality of word lines from the global word line, and in which the second transistor couples the word line to the ground voltage.

5. The memory circuit of claim 4, wherein
responsive to the word line in the plurality of word lines being selected for a first operation type, the control circuitry is in one of the first mode and the second mode with respect to the word line in the plurality of word lines, and
responsive to the word line in the plurality of word lines being selected for a second operation type different from the first operation type, the control circuitry is in another of the first mode and the second mode with respect to the word line in the plurality of word lines.

6. The memory circuit of claim 4, wherein
responsive to the word line in the plurality of word lines being deselected for a first operation type, the control circuitry is in one of the first mode and the second mode with respect to the word line in the plurality of word lines, and
responsive to the word line in the plurality of word lines being deselected for a second operation type different from the first operation type, the control circuitry is in another of the first mode and the second mode with respect to the word line in the plurality of word lines.

7. The memory circuit of claim 4, wherein responsive to the word line in the plurality of word lines being selected for the erase operation, the control circuitry is in the second mode with respect to the word line in the plurality of word lines.

8. The memory circuit of claim 4, wherein responsive to the word line in the plurality of word lines being deselected for the erase operation, the control circuitry is in the first mode with respect to the word line in the plurality of word lines.

9. A method of operating memory, comprising:
responsive to receiving an erase command for the erase operation, coupling a reference voltage to a first set of one or more word lines of a plurality of word lines coupled to a memory array, the first set of one or more word lines deselected in the memory operation, and
after performing a precharge of the first set of one or more word lines to the reference voltage, floating the first set of one or more word lines.

10. The method of claim 9, further comprising:
responsive to receiving the erase command for the erase operation, after performing the precharge of the first set of one or more word lines to the reference voltage, performing said floating the first set of one or more word lines prior to erasing a second set of one or more word lines of the plurality of word lines coupled to the memory array, the second set of one or more word lines selected in the erase operation.

11. The method of claim 9, wherein the control circuitry performs:
responsive to receiving the erase command for the erase operation, after a time interval following the precharge of the first set of one or more word lines to the reference voltage, further charging the first set of one or more word lines from the reference voltage to a boosted voltage.

12. The method of claim 9, further comprising:
in at least an erase operation of the memory, performing:
in a first mode of word line control circuitry, coupling a word line in the plurality of word lines to a global word line via a first transistor, and decoupling the word line in the plurality of word lines from the reference voltage via a second transistor; and
in a second mode of word line control circuitry, decoupling the word line in the plurality of word lines from the global word line via the first transistor, and coupling the word line to a reference voltage via the second transistor.

13. The method of claim 12, further comprising:
responsive to the word line in the plurality of word lines being selected for the erase operation, operating the control circuitry in one of the first mode and the second mode with respect to the word line in the plurality of word lines, and
responsive to the word line in the plurality of word lines being deselected for the erase operation, operating the control circuitry in another of the first mode and the second mode with respect to the word line in the plurality of word lines.

14. The method of claim 12, wherein
responsive to the word line in the plurality of word lines being selected for a first operation type, operating the control circuitry in one of the first mode and the second mode with respect to the word line in the plurality of word lines, and
responsive to the word line in the plurality of word lines being selected for a second operation type different from the first operation type, operating the control circuitry in another of the first mode and the second mode with respect to the word line in the plurality of word lines.

15. The method of claim 12, wherein
responsive to the word line in the plurality of word lines being deselected for a first operation type, operating the control circuitry in one of the first mode and the second mode with respect to the word line in the plurality of word lines, and
responsive to the word line in the plurality of word lines being deselected for a second operation type different from the first operation type, operating the control circuitry in another of the first mode and the second mode with respect to the word line in the plurality of word lines.

16. The method of claim 12, wherein responsive to the word line in the plurality of word lines being selected for the erase operation, operating the control circuitry in the second mode with respect to the word line in the plurality of word lines.

17. The method of claim 12, wherein responsive to the word line in the plurality of word lines being deselected for the erase operation, operating the control circuitry in the first mode with respect to the word line in the plurality of word lines.

18. The method of claim 12, wherein responsive to the word line in the plurality of word lines being selected for a non-erase operation, operating the control circuitry in the first mode with respect to the word line in the plurality of word lines.

19. The method of claim 12, wherein responsive to the word line in the plurality of word lines being deselected for a non-erase operation, operating the control circuitry in the second mode with respect to the word line in the plurality of word lines.

20. A memory circuit, comprising:
means responsive to receiving an erase command for the erase operation, coupling a reference voltage to a first set of one or more word lines of a plurality of word lines coupled to a memory array, the first set of one or more word lines deselected in the memory operation; and after performing a precharge of the first set of one or more word lines to the reference voltage, floating the first set of one or more word lines.

* * * * *